(12) United States Patent
Wayama et al.

(10) Patent No.: US 10,326,948 B2
(45) Date of Patent: Jun. 18, 2019

(54) RADIATION IMAGING APPARATUS, RADIATION IMAGING SYSTEM, AND CONTROL METHOD FOR RADIATION IMAGING APPARATUS

(71) Applicant: CANON KABUSHIKI KAISHA, Tokyo (JP)

(72) Inventors: Hiroshi Wayama, Kawasaki (JP); Minoru Watanabe, Honjo (JP); Keigo Yokoyama, Honjo (JP); Masato Ofuji, Takasaki (JP); Jun Kawanabe, Kumagaya (JP); Kentaro Fujiyoshi, Tokyo (JP); Kazuya Furumoto, Honjo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 376 days.

(21) Appl. No.: 15/098,224

(22) Filed: Apr. 13, 2016

(65) Prior Publication Data

US 2016/0316547 A1    Oct. 27, 2016

(30) Foreign Application Priority Data

Apr. 24, 2015  (JP) ................................. 2015-089366
Feb. 26, 2016  (JP) ................................. 2016-035845

(51) Int. Cl.
*H04N 5/32*     (2006.01)
*H01L 27/146*   (2006.01)

(52) U.S. Cl.
CPC ......... *H04N 5/32* (2013.01); *H01L 27/14632* (2013.01); *H01L 27/14663* (2013.01)

(58) Field of Classification Search
CPC ........... A61B 5/72; A61B 5/7203; A61B 6/00; A61B 6/42; A61B 6/4233; A61B 6/54; A61B 2560/00; A61B 2560/02; A61B 2560/0204; A61B 2560/0214; A61B 2562/00; A61B 2562/02; A61B 2562/04; A61B 2562/046; A61B 2576/00;
(Continued)

(56) References Cited

U.S. PATENT DOCUMENTS 4,751,580 A *  6/1988  Fitzgerald ................ H04N 5/63
                                                         307/64
7,888,648 B2 *  2/2011  Seino ........................ G01T 1/24
                                                      250/370.01

(Continued)

FOREIGN PATENT DOCUMENTS

JP    2011-101693 A    5/2011

*Primary Examiner* — Anastasia Midkiff
(74) *Attorney, Agent, or Firm* — Canon U.S.A., Inc. IP Division

(57) ABSTRACT

A radiation imaging apparatus includes a plurality of pixels, each of which includes a conversion element and a transistor, a plurality of drive lines connected to gates of the transistors, a drive circuit unit configured to supply a voltage to the plurality of drive lines, and a control unit configured to control the drive circuit unit. The control unit performs control of causing the drive circuit unit to apply a different voltage that is between the OFF voltage and the ON voltage and is different from the OFF voltage and the ON voltage to the plurality of drive lines in a different period different from a period in which storage control is performed and a period in which read control is performed.

15 Claims, 12 Drawing Sheets

(58) Field of Classification Search
CPC .... G01T 1/00; G01T 1/16; G01T 1/17; G01T 1/171; G01T 1/175; G01T 1/20; G01T 1/2006; G01T 1/2018; G01T 1/208; G01T 1/24; G01T 1/245; G01T 1/246; G01T 1/247; G01T 7/00; H01L 27/14; H01L 27/144; H01L 27/1446; H01L 27/146; H01L 27/14601; H01L 27/14603; H01L 27/14605; H01L 27/14612; H01L 27/14614; H01L 27/1463; H01L 27/14634; H01L 27/14636; H01L 27/14643; H01L 27/14658; H01L 49/02; H01L 27/14659; H01L 27/14661; H01L 27/14663; H01L 27/14665; H01L 27/14676; H01L 27/148; H01L 27/14806; H01L 27/1812; H01L 27/14831; H01L 27/14868; H01L 27/14893; H01L 27/24; H01L 27/2436; H01L 27/2445; H04N 5/30; H04N 5/32; H04N 5/335; H04N 5/3355; H04N 5/341; H04N 5/357; H04N 5/361; H04N 5/369; H04N 5/3698; H04N 5/374; H04N 5/3741; H04N 5/3742; H04N 5/3745; H04N 5/37452; H04N 5/37455; H04N 5/37457; H06G 1/00; H06G 1/08; H06G 1/26; H06G 1/32; H06G 1/56

See application file for complete search history.

(56) References Cited

U.S. PATENT DOCUMENTS

| | | | |
|---|---|---|---|
| 9,961,284 B2* | 5/2018 | Koga | H04N 5/3575 |
| 2001/0030704 A1* | 10/2001 | Kimura | H04N 3/155 |
| | | | 348/308 |
| 2010/0309357 A1* | 12/2010 | Oike | H01L 27/14609 |
| | | | 348/302 |
| 2013/0264488 A1* | 10/2013 | Sugawara | G01T 1/16 |
| | | | 250/394 |

* cited by examiner

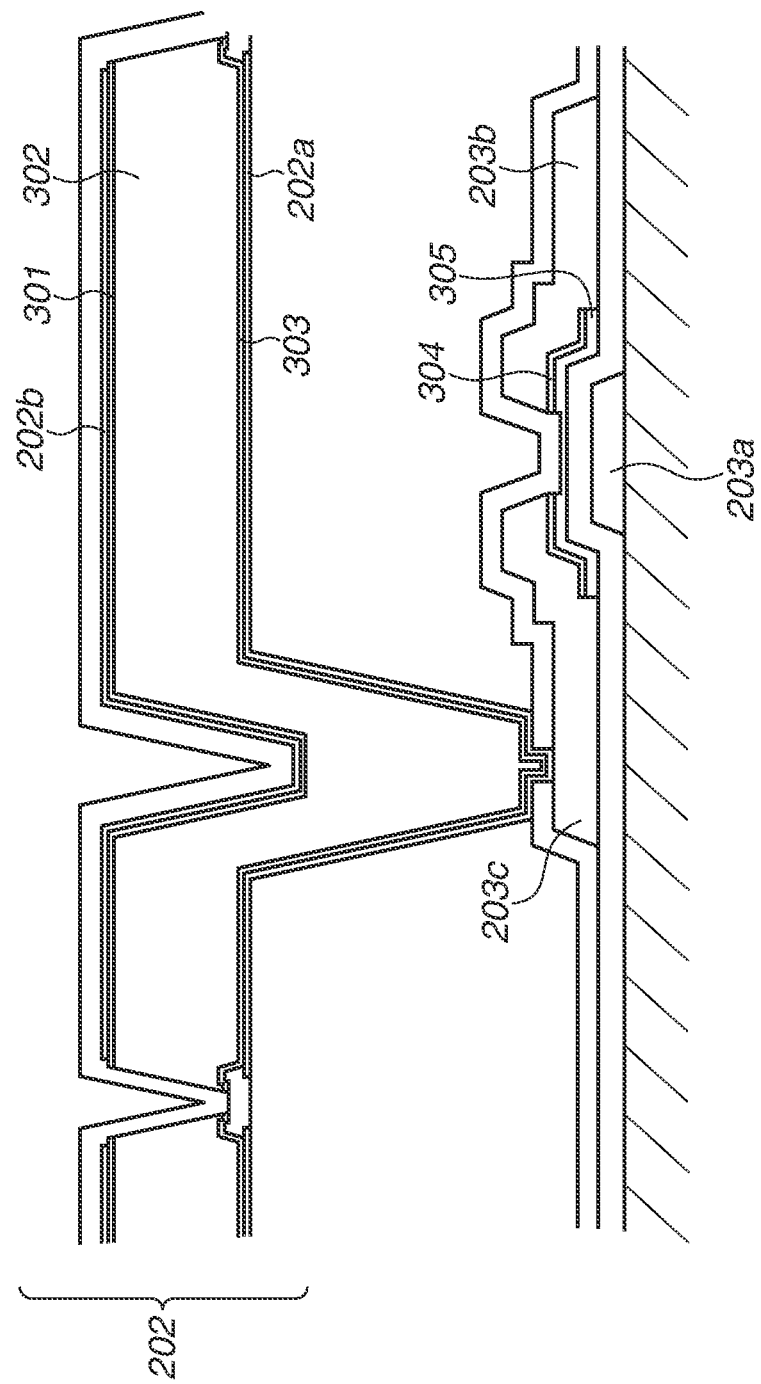

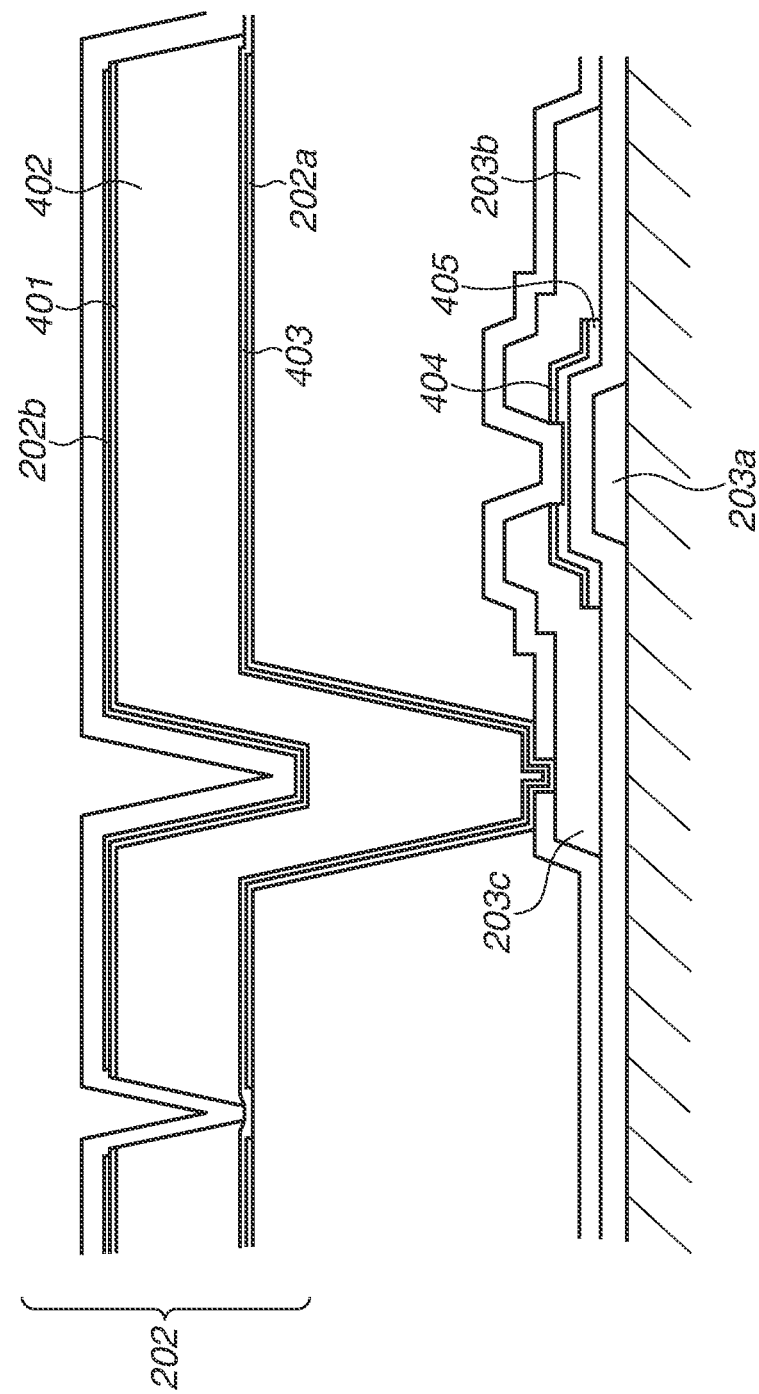

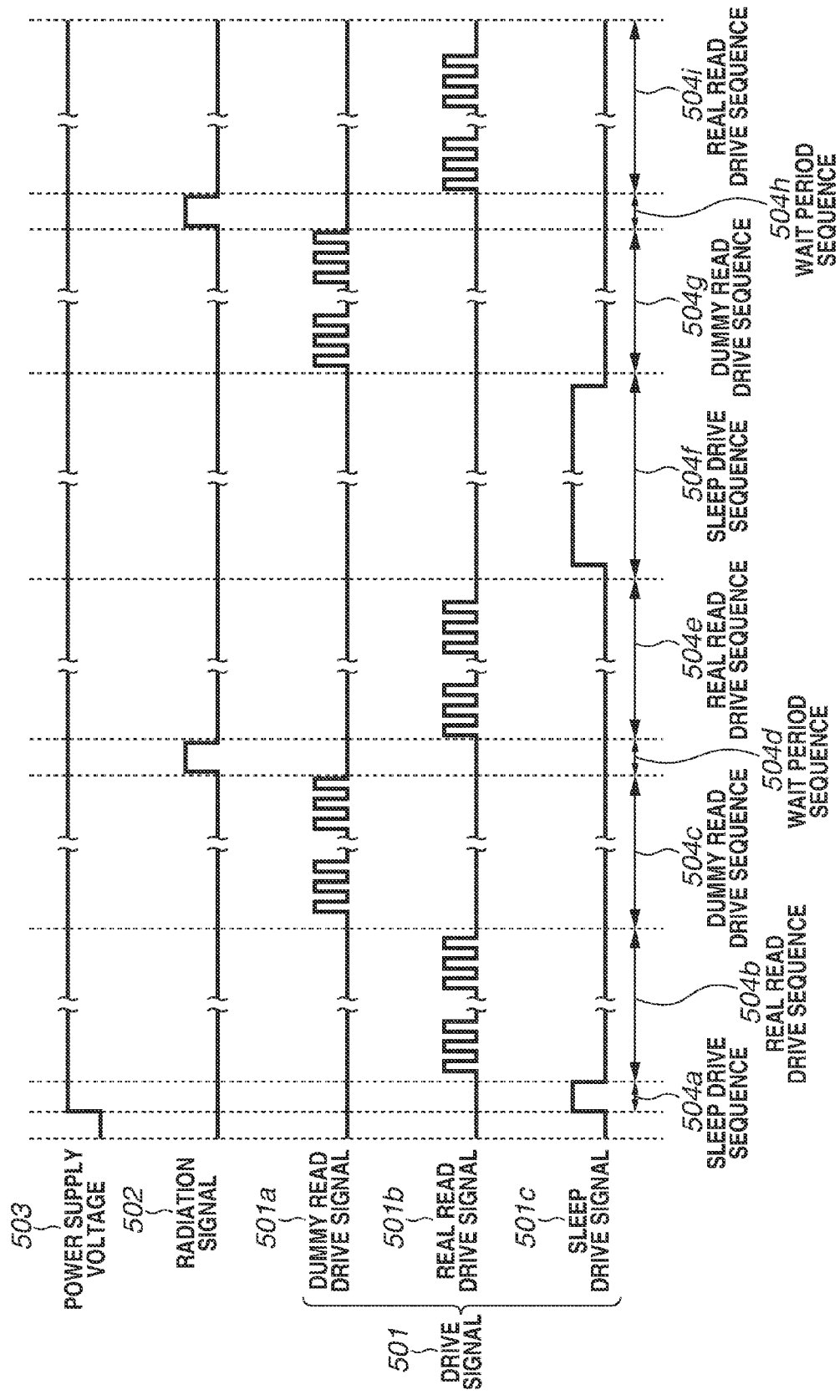

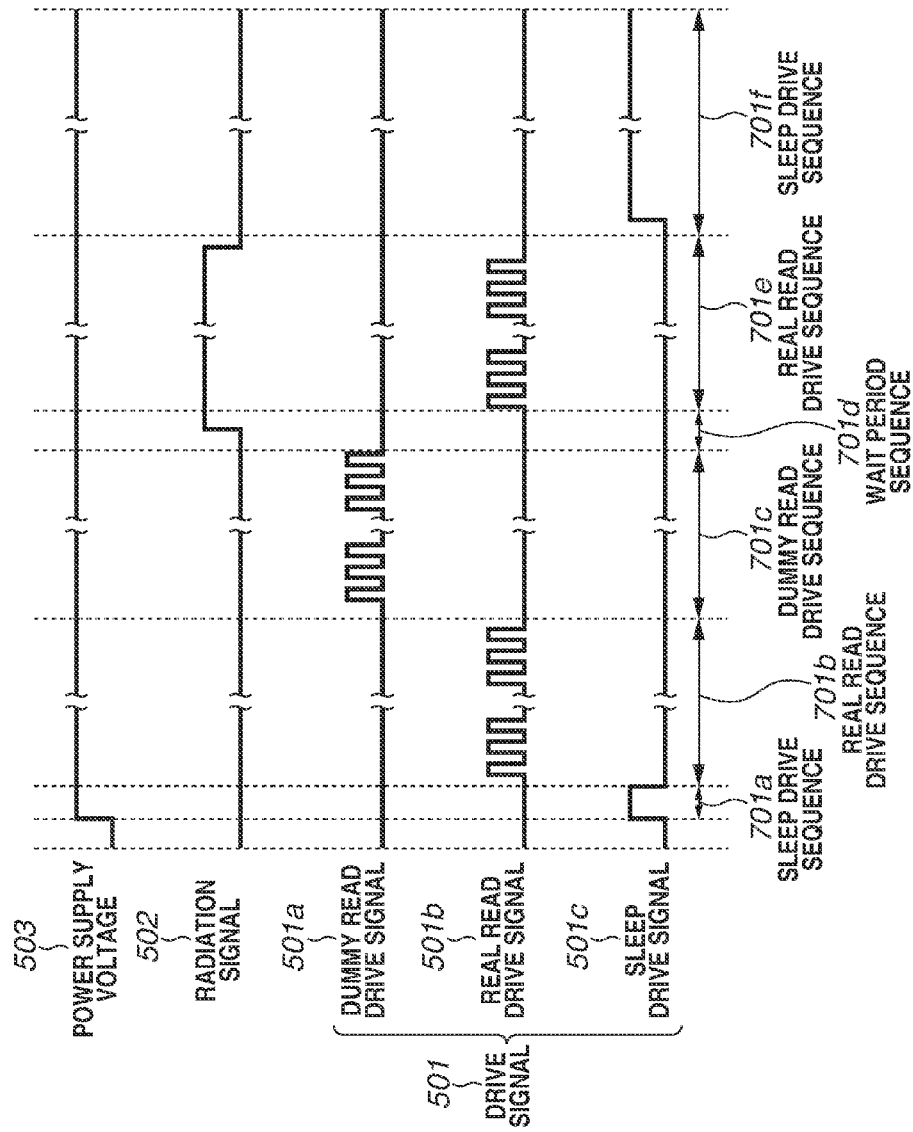

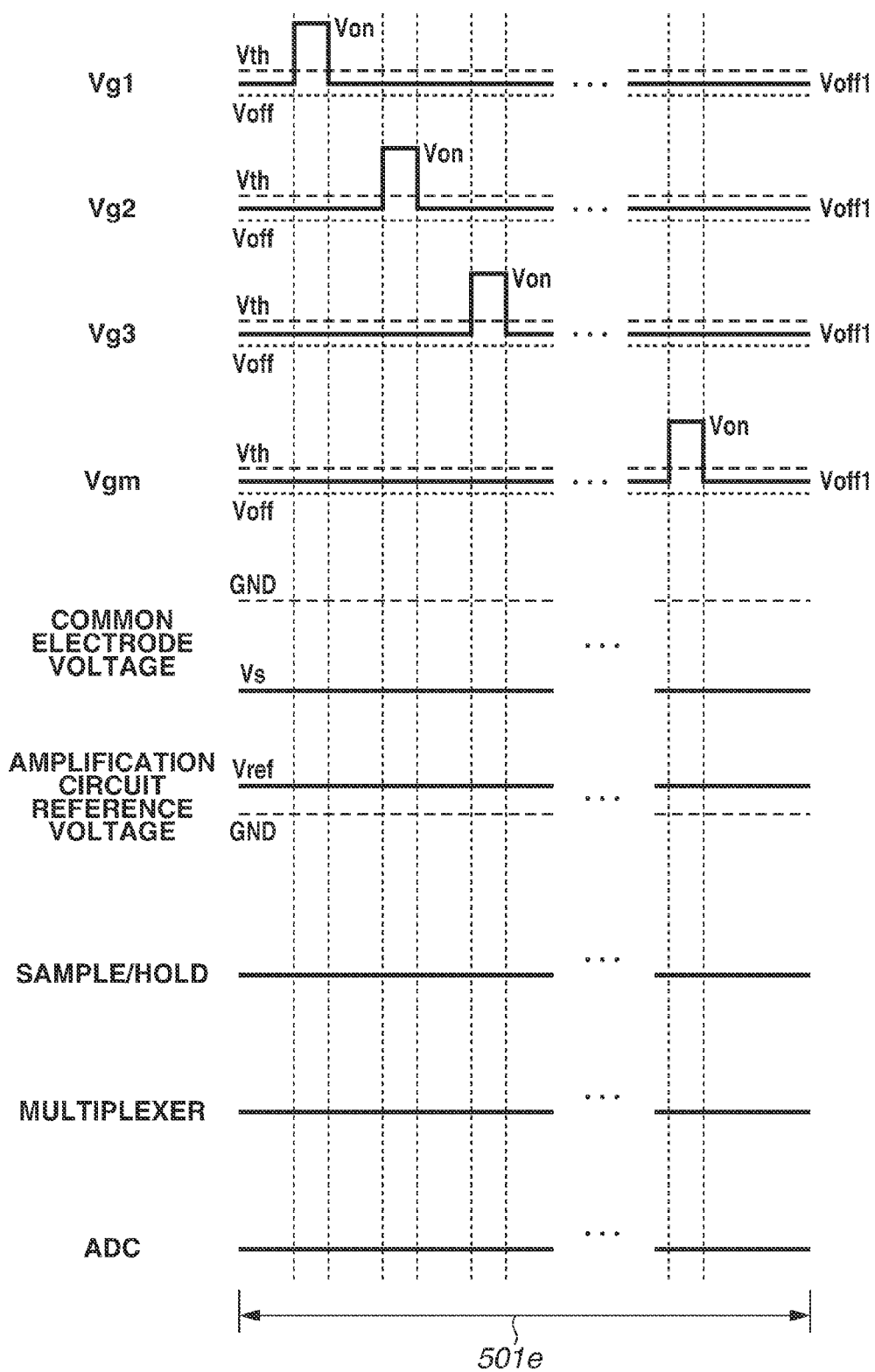

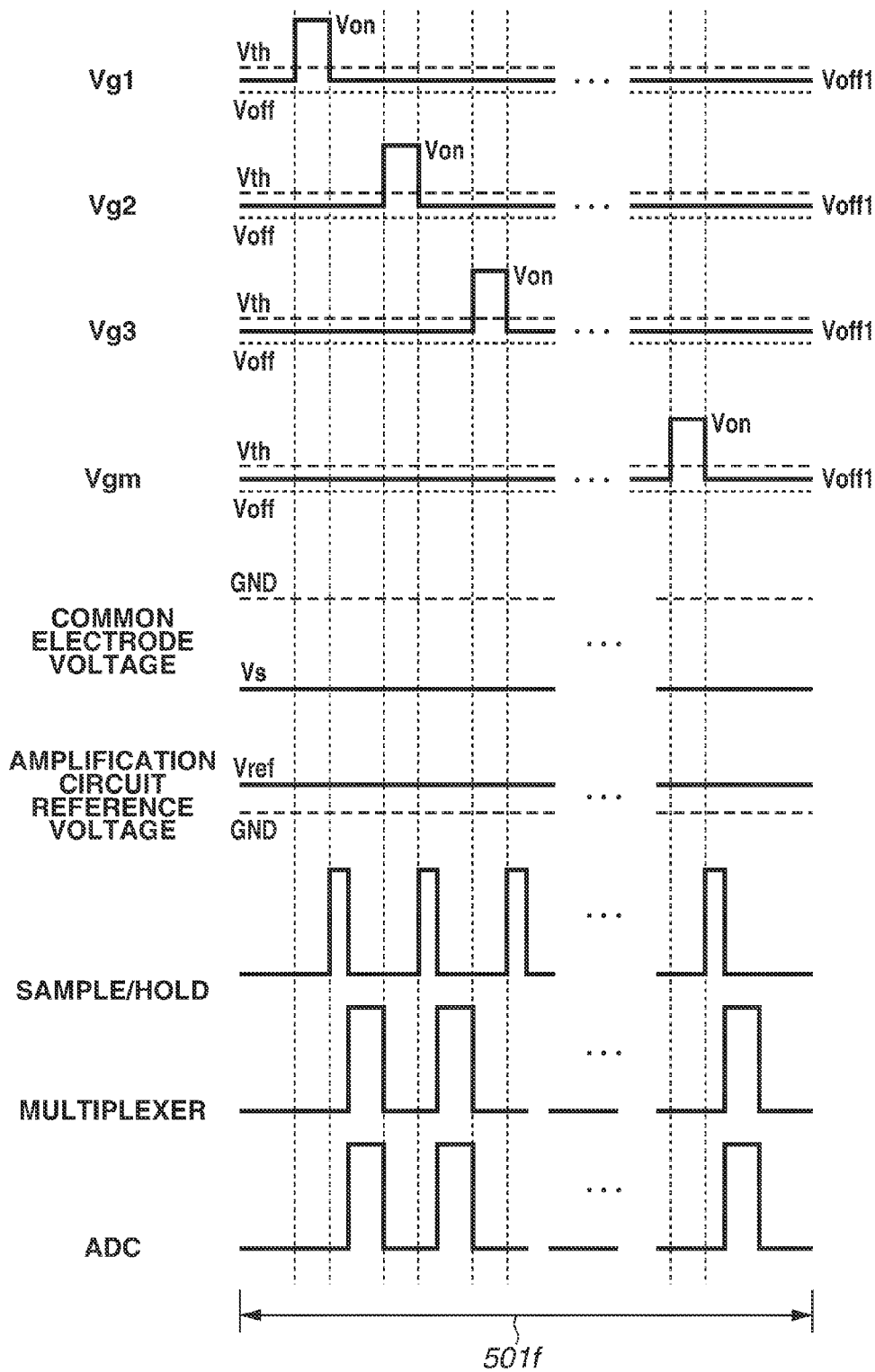

RADIATION IMAGING APPARATUS, RADIATION IMAGING SYSTEM, AND CONTROL METHOD FOR RADIATION IMAGING APPARATUS

BACKGROUND OF THE INVENTION

Field of the Invention

The present invention relates to a radiation imaging apparatus, a radiation imaging system, and a control method for a radiation imaging apparatus.

Description of the Related Art

Radiation imaging apparatuses generate an image based on a difference between an image corresponding to a state with radiation emitted (hereinafter, referred to as a radiation image) and an image corresponding to a state with no radiation emitted (hereinafter, referred to as a dark image). It is difficult to generate an accurate image without taking information corresponding to the dark image into consideration, especially when amorphous silicon is used for photoelectric conversion elements that are disposed in the radiation imaging apparatus and convert information on light into information on electrons. The dark image is highly correlated with the temperature in the radiation imaging apparatus. More specifically, a rise in the temperature tends to result in a larger number of dark image components. An amplification circuit that integrates electrical charges, obtained with the radiation, has a characteristic also highly correlated with the temperature. Thus, generally, the characteristic is unstable due to temperature drift for a certain period of time after power is supplied to the amplification circuit.

Thus, in some radiation imaging apparatuses using amorphous silicon, after the power is supplied, a warming-up operation is performed to achieve a predetermined temperature in the radiation imaging apparatus and a predetermined temperature of the amplification circuit, so that a state with a predetermined number of dark image components and with the temperature drift reduced can be achieved. However, taking the time required for achieving the state with a predetermined number of dark image components and with the temperature drift reduced is extremely inconvenient in a case where the radiation imaging apparatus is required for emergency purposes, such as in an emergency hospital. On the other hand, an image formed of a difference between the radiation image and the dark image, wherein said dark image is not obtained in the state with a predetermined number of dark image components, due to a reduced the temperature drift.

Thus, in recent years, a method has been employed in which the warming-up operation is performed with the radiation imaging apparatus constantly turned on, so that the radiation imaging apparatus is ready to be immediately used, as discussed in Japanese Patent Application Laid-Open No. 2011-101693. In Japanese Patent Application Laid-Open No. 2011-101693 discusses a state where a voltage applied to the photoelectric conversion elements and thin-film transistors for reading the electrical charges accumulated in the photoelectric conversion elements is set to be equal to the ground potential. This state is referred to as a sleep state in Japanese Patent Application Laid-Open No. 2011-101693. However, it is difficult to use the radiation imaging apparatus in the state with a predetermined number of dark image components for the emergency use due to the following reason. Generally, in the radiation imaging apparatus, a predetermined voltage is applied so that electrical charges are accumulated in the photoelectric conversion elements. Thus, in a configuration where the voltage described above is set to be equal to the ground potential in the sleep state and then is suddenly raised to be applied to the photoelectric conversion elements for the emergency use, a certain period of time is required for achieving a state with predetermined electrical charges in the photoelectric conversion elements. In such a period, reliable image data is difficult to acquire due to the varying of the number of dark image components.

In another available method for general radiation imaging apparatuses, voltages applied to the photoelectric conversion elements and the thin-film transistors are controlled through the warming-up operation with a timing that is the same as that in a normal read drive, while the amplification circuit is being driven. However, the method involves a shift in a threshold voltage of the thin-film transistors, causing a change in the characteristic. Furthermore, the warming-up operation might be performed for quite a long period of time, and such a long period results in the threshold largely shifted. The shift in the threshold leads to varying of components leaked from the transistors, adversely affecting the image.

With the control method using the sleep state, as discussed in Japanese Patent Application Laid-Open No. 2011-101693, the temperature drift of the amplification circuit can be reduced, but it is difficult to maintain the threshold of the thin-film transistors at a constant value, while preventing the number of dark components from varying, which inevitably occurs when a sensor substrate is used, for the emergency use.

SUMMARY OF THE INVENTION

According to an aspect of the present invention, a radiation imaging apparatus includes a plurality of pixels arranged in a form of a matrix and configured to generate a signal corresponding to radiation, each of the plurality of pixels including a conversion element and a transistor, a plurality of drive lines connected to gates of the transistors of the plurality of pixels, a drive circuit unit configured to supply a voltage to the plurality of drive lines to drive the plurality of pixels, and a control unit configured to control the drive circuit unit. The control unit performs storage control of causing the drive circuit unit to apply an OFF voltage, for turning off the transistor, to the plurality of drive lines, so that the signal is stored in each of the plurality of pixels, real read control of causing the drive circuit unit to apply an ON voltage, for turning on the transistor, sequentially to the plurality of drive lines, so that the signal is read from each of the plurality of pixels, and control of causing the drive circuit unit to apply a different voltage that is between the OFF voltage and the ON voltage and is different from the OFF voltage and the ON voltage to the plurality of drive lines in a different period different from a period in which the storage control is performed and a period in which the real read control is performed.

Further features of the present invention will become apparent from the following description of exemplary embodiments with reference to the attached drawings.

BRIEF DESCRIPTION OF THE DRAWINGS

FIGS. 3A and 3B are each a cross-sectional view illustrating an example of a configuration of a photodiode and a thin-film transistor.

FIG. 4 is a timing chart illustrating a control method for the radiation imaging system.

FIG. 7 is a timing chart illustrating a control method for the radiation imaging system.

FIGS. 8A and 8B are each a timing chart illustrating an idling drive sequence.

DESCRIPTION OF THE EMBODIMENTS

Figure 1:
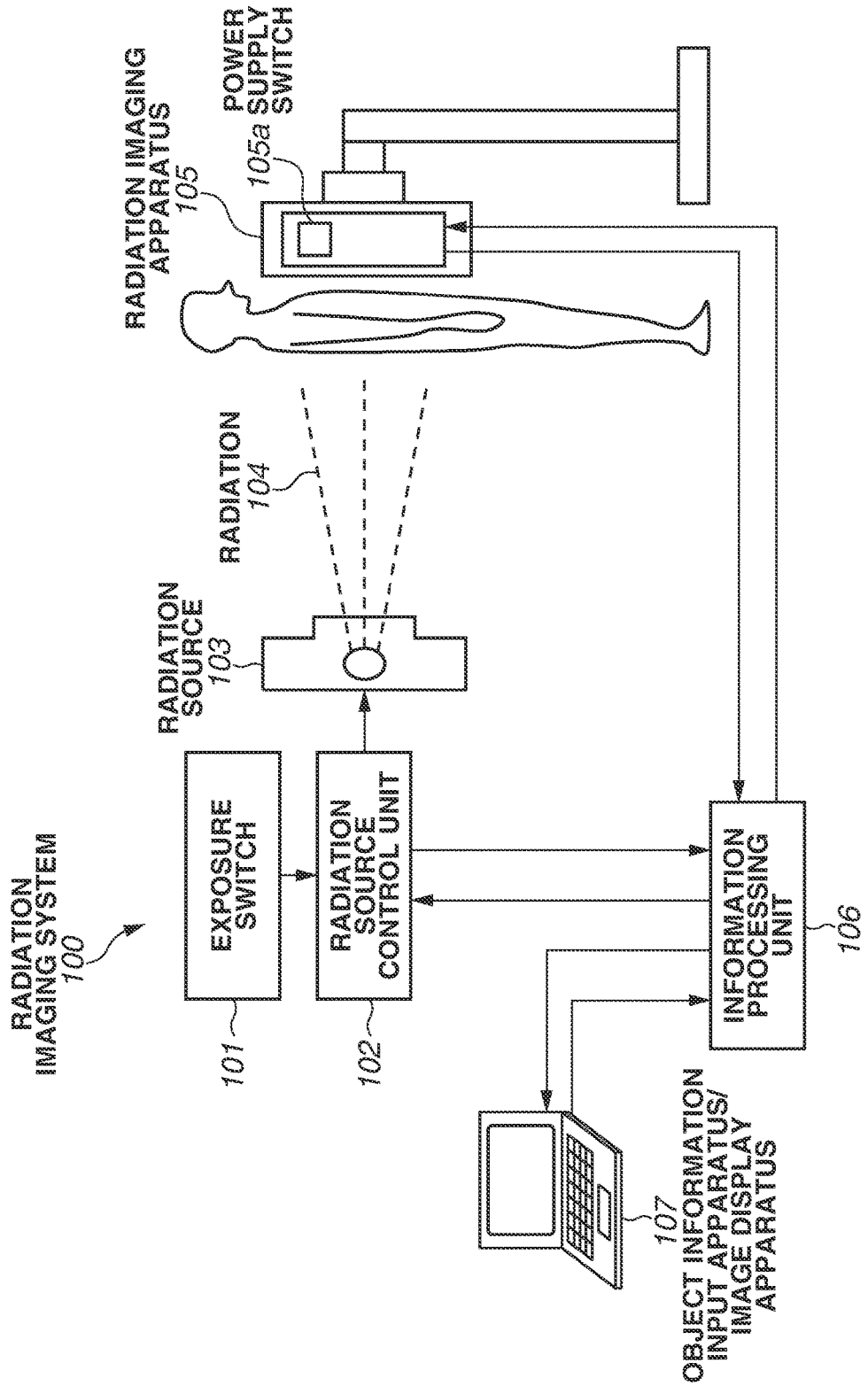
FIG. 1 is a diagram illustrating an example of a configuration of a radiation imaging system according to a first exemplary embodiment.

FIG. 1 is a diagram illustrating an example of a configuration of a radiation imaging system 100 according to a first exemplary embodiment of the present invention. The radiation imaging system 100 includes an exposure switch 101, a radiation source control unit 102, a radiation source 103, a radiation imaging apparatus 105, an information processing unit 106, and an object information input apparatus/image display apparatus 107. The radiation imaging apparatus 105 includes a power supply switch 105a for the radiation imaging apparatus 105. The exposure switch 101 is electrically connected to the radiation source control unit 102 via a wired cable, and outputs a switch signal to the radiation source control unit 102. The radiation source control unit 102 controls the radiation source 103 in accordance with the switch signal. The radiation source 103 emits radiation 104, under the control of the radiation source control unit 102. The radiation 104 is emitted to the radiation imaging apparatus 105 through a patient. A doctor and a technician can cause the radiation 104 to be emitted towards the patient by operating the exposure switch 101. The radiation source control unit 102 is electrically connected to the exposure switch 101, the radiation source 103, and the information processing unit 106. The information processing unit 106 is electrically connected to the object information input apparatus/image display apparatus 107 and the radiation imaging apparatus 105. The radiation imaging apparatus 105 converts the radiation 104 entered thereinto into an electrical signal, and outputs the electrical signal thus obtained to the information processing unit 106. The information processing unit 106 processes the signal input thereto and outputs the process result to the radiation source control unit 102. The radiation imaging apparatus 105 converts the radiation 104 entered thereinto into an image corresponding to the electrical signal, and outputs the resultant image to the information processing unit 106. The information processing unit 106 processes the image input thereto, and outputs an image as the process result to the object information input apparatus/image display apparatus 107. The object information input apparatus/image display apparatus 107 displays the image.

When the power supply switch 105a is operated, the radiation imaging apparatus 105 is turned on to be usable. More specifically, when the power supply switch 105a is operated, a voltage is applied to a sensor substrate to start to drive an amplification circuit in the radiation imaging apparatus 105. The exposure switch 101, the radiation source control unit 102, the radiation source 103, the radiation imaging apparatus 105, the information processing unit 106, and the object information input apparatus/image display apparatus 107 each include an input/output terminal, and thus can transmit and receive signals to and from each other.

Figure 2:
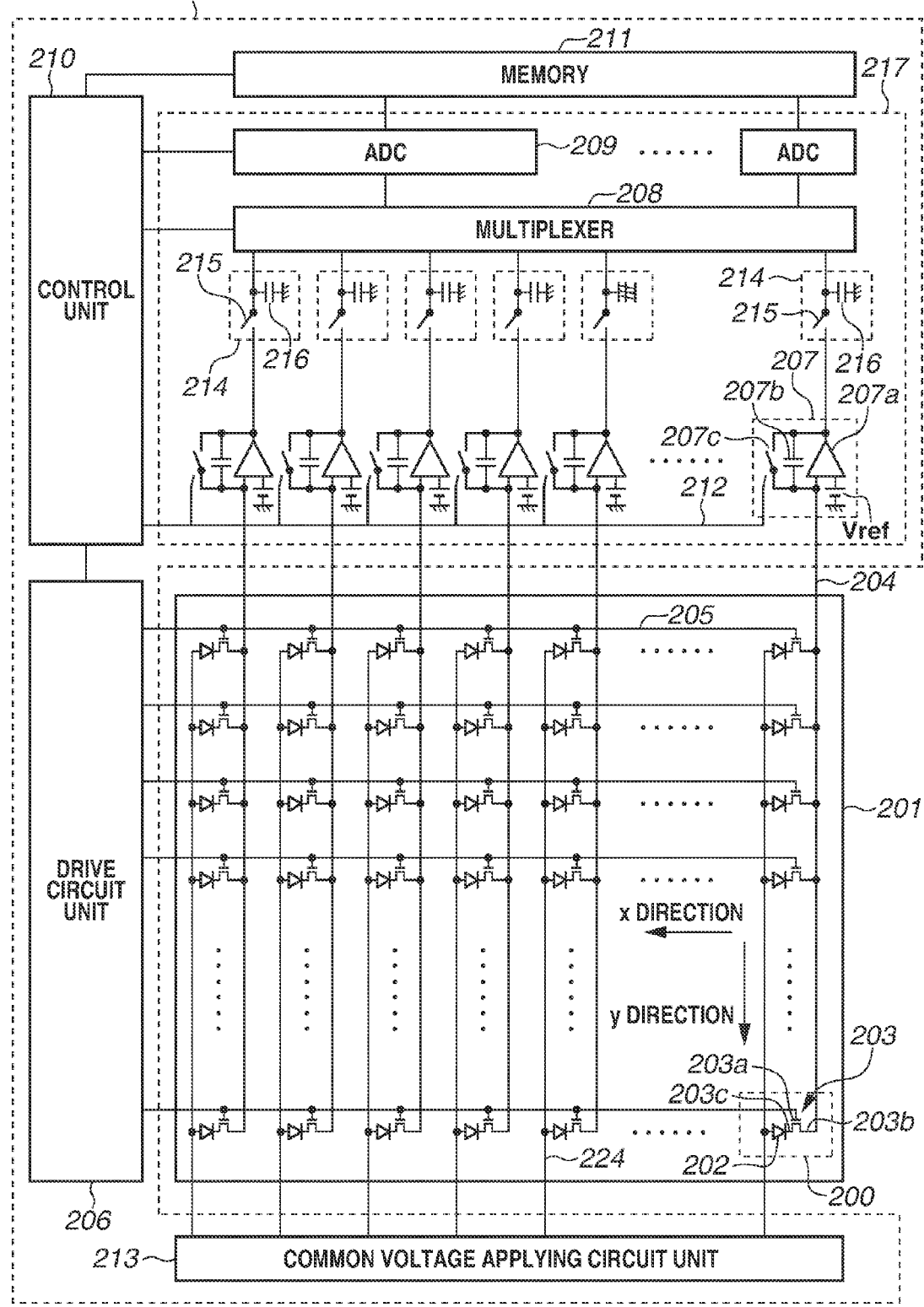
FIG. 2 is a diagram illustrating an example of a configuration of a radiation imaging apparatus illustrated in FIG. 1.

FIG. 2 is a diagram illustrating an example of a configuration of the radiation imaging apparatus 105 illustrated in FIG. 1. The radiation imaging apparatus 105 includes a circuit unit 105b and a pixel array unit 201. The pixel array unit 201 includes a plurality of pixels 200 arranged in a form of a matrix. Each of the plurality of pixels 200 includes a photodiode 202 and a thin-film transistor 203. The thin-film transistor 203 includes a gate electrode 203a, a source electrode 203b, and a drain electrode 203c. In each pixel 200, a cathode (a second terminal of a conversion element) of the photodiode 202 is electrically connected to the drain electrode 203c of the thin-film transistor 203. A plurality of drive lines 205 is commonly and electrically connected to the gate electrodes 203a of the thin-film transistors 203 in the respective pixels 200 in a corresponding one of rows. A plurality of signal lines 204 is commonly and electrically connected to the source electrodes 203b of the thin-film transistors 203 in the respective pixels 200 in a corresponding one of columns. A plurality of common voltage lines 224 is commonly and electrically connected to anodes (first terminals of the conversion elements) of the photodiodes 202 in the respective pixels 200 in a corresponding one of the columns. One of the source electrode 203b and the drain electrode 203c of the thin-film transistor 203 may be electrically connected to the cathode (the second terminal of the conversion element) of the photodiode 202, and the other of the source electrode 203b and the drain electrode 203c may be electrically connected to the signal line 204.

The circuit unit 105b includes a drive circuit unit 206, a control unit 210, a memory 211, a common voltage applying circuit unit 213, and a signal processing unit 217. The signal processing unit 217 includes amplification circuits 207 and sample/hold circuits 214 in the respective columns, as well as a multiplexer 208 and analog-to-digital converters (ADC) 209. The plurality of amplification circuits 207 is electrically connected to the plurality of signal lines 204, respectively. Each of the amplification circuits 207 includes a differential amplifier 207a, a capacitor 207b, and a reset switch 207c. The differential amplifier 207a receives a voltage of the signal line 204 via an inverting input terminal, and receives a reference voltage Vref via a non-inverting input terminal. The capacitor 207b and the reset switch 207c are connected between the inverting input terminal and an output terminal of the differential amplifier 207a. The drive circuit unit 206 serves as a drive line control unit that controls voltages applied to the plurality of drive lines 205. The common voltage applying circuit unit 213 serves as a common voltage applying unit that applies the same voltage to the plurality of common voltage lines 224. In other words, the common voltage applying circuit unit 213 applies the same voltage to the anodes of the photodiodes 202 in all of the pixels 200.

FIGS. 3A and 3B are each a cross-sectional view illustrating an example of a configuration of the photodiode 202 and the thin-film transistor 203 illustrated in FIG. 2. FIG. 3A illustrates an example where the photodiode 202 is a positive-intrinsic-negative (PIN) photodiode. The PIN photodiode 202 includes a p-type semiconductor layer 301, an intrinsic semiconductor layer 302, and an n-type semiconductor layer 303 that are stacked in this order from an upper side. A common electrode 202b is disposed on an upper portion of the p-type semiconductor layer 301, and an individual electrode 202a is disposed on a lower portion of the n-type semiconductor layer 303. The thin-film transistor 203 illustrated in FIG. 2 includes the gate electrode 203a, the source electrode 203b, the drain electrode 203c, an n-type semiconductor layer 304, and an intrinsic semiconductor layer 305. The drain electrode 203c is electrically connected to the individual electrode 202a of the PIN photodiode 202.

FIG. 3B is a cross-sectional view illustrating another example of a configuration of the photodiode 202 and the thin-film transistor 203 illustrated in FIG. 2. FIG. 3B illustrates an example where the photodiode 202 is a metal insulator semiconductor (MIS) photodiode. The MIS photodiode 202 includes an n-type semiconductor layer 401, an intrinsic semiconductor layer 402, and an insulating layer 403 that are stacked in this order from an upper side. The common electrode 202b is disposed on an upper portion of the n-type semiconductor layer 401, and the individual electrode 202a is disposed on a lower portion of the insulating layer 403. The thin-film transistor 203 illustrated in FIG. 2 includes the gate electrode 203a, the source electrode 203b, the drain electrode 203c, an n-type semiconductor layer 404, and an intrinsic semiconductor layer 405. The drain electrode 203c is electrically connected to the individual electrode 202a of the MIS photodiode 202.

Next, the radiation imaging apparatus 105 will be described with reference to FIGS. 2, 3A, 3B, 4, 5A, and 5B. The radiation imaging apparatus 105 includes the pixel array unit 201 and the circuit unit 105b. The radiation imaging apparatus 105 may be a direct type radiation imaging apparatus that directly converts the radiation 104 into an electrical signal to obtain a signal electrical charge, or an indirect type radiation imaging apparatus that converts the radiation 104 into visible light and then converts the visible light into a signal electrical charge. If the radiation imaging apparatus 105 is the indirect type radiation imaging apparatus, a scintillator is provided in the pixel array unit 201. The scintillator is disposed to cover the entire surface of the pixel array unit 201 of the radiation imaging apparatus 105. Examples of a material of the scintillator include gadolinium oxysulfide (GOS) and cesium iodide (CsI). The scintillator converts the radiation 104 into visible light, and the photodiodes 202 each convert the visible light into an electrical signal. The scintillator and the photodiode 202 serve as the conversion element that generates an electrical signal corresponding to the radiation 104. If the radiation imaging apparatus 105 is the direct type radiation imaging apparatus, no scintillator is required and a conversion element that directly converts the radiation 104 into an electrical signal is provided instead of the photodiode 202.

The pixel array unit 201 is controlled by the drive circuit unit 206 and the common voltage applying circuit unit 213. The pixel array unit 201 includes the plurality of pixels 200 arranged in a form of a matrix (m pixels in an x direction x n pixels in a y direction). The pixels 200 each include the photodiode 202 and the thin-film transistor 203. The thin-film transistor 203 outputs the electrical charge, as a result of the conversion by the photodiode 202, to the signal line 204 in accordance with the voltage applied to the drive line 205. About 1000 to 4000 pixels 200 are present in each of the x and the y directions, and thus the total number of pixels 200 is about 10 million. The drive lines 205 extending in the x direction and the signal lines 204 extending in the y direction are orthogonal to each other. Each of the drive lines 205 is electrically connected to the gate electrodes 203a of all of the pixels 200 in a corresponding one of the rows. Each of the signal lines 204 is electrically connected to the source electrodes 203b of all of the pixels 200 in a corresponding one of the columns.

For example, the photodiode 202 is the PIN photodiode that includes the p-type semiconductor layer 301, the intrinsic semiconductor layer 302, and the n-type semiconductor layer 303 that are stacked in this order from the upper side, as illustrated in FIG. 3A. Alternatively, a NIP photodiode 202 that has a reversed configuration, and thus includes an n-type semiconductor layer, an intrinsic semiconductor layer, and a p-type semiconductor layer that are stacked in this order from the upper side may be used. Furthermore, the MIS photodiode 202 that includes the n-type semiconductor layer 401, the intrinsic semiconductor layer 402, and the insulating layer 403 that are stacked in this order from the upper side as illustrated in FIG. 3B may be used. The MIS photodiode 202 may alternatively include a p-type semiconductor layer. The photodiode 202 includes two electrodes (i.e. the individual electrode 202a and the common electrode 202b) one of which has potential fixed by the common voltage applying circuit unit 213. In FIGS. 3A and 3B, the individual electrode 202a is disposed on the lower portion of the photodiode 202 to be electrically connected to the thin-film transistor 203. The common electrode 202b has the potential fixed by the common voltage applying circuit unit 213. As a result, an electric field is generated in the photodiode 202. When the radiation 104 enters into the radiation imaging apparatus 105 with the potential of the common electrode 202b fixed, a pair of an electron and a hole is produced in the photodiode 202. One of the electron and the hole is attracted by the electric field, generated by the common voltage applying circuit unit 213, whereby the potential of the individual electrode 202a, which is unfixed, changes due to accumulation of the electrical charges in the individual electrode 202a. For example, when the n-type thin-film transistor 203 and the MIS photodiode 202 are used, the thin-film transistor 203 and the individual electrode 202b are electrically connected to each other, and the potential of the individual electrode 202b changes due to the entrance of the radiation 104. In one embodiment, if the radiation imaging apparatus 105 is the direct type radiation imaging apparatus, the photodiode 202 is formed of amorphous selenium or the like. If the radiation imaging apparatus 105 is the indirect type radiation imaging apparatus, the semiconductor of the photodiode 202 may be formed of amorphous silicon or polysilicon.

The thin-film transistor 203 is a switching element, and includes the gate electrode 203a, the source electrode 203b, and the drain electrode 203c. The thin-film transistor 203 may be an n-type thin-film transistor using an n-type semiconductor layer or a p-type thin-film transistor using a p-type semiconductor layer. The n-type thin-film transistor 203 turns on when a voltage applied to the gate electrode 203a becomes a voltage Von higher than a threshold voltage Vth. On the other hand, the p-type thin-film transistor 203 turns on when a voltage applied to the gate electrode 203a becomes a voltage Von lower than the threshold voltage Vth. The gate electrode 203a is electrically connected to the drive line 205, the source electrode 203b is electrically connected to the signal line 204, and the drain electrode 203c is electrically connected to the individual electrode 202a of the photodiode 202. The thin-film transistor 203 may be a bottom-gate thin-film transistor with the drive line 205 positioned on the lower portion of the thin-film transistor 203, or may be a top-gate thin-film transistor with the drive line 205 positioned on the upper portion of the thin-film transistor 203.

The photodiode 202 and the thin-film transistor 203 are formed by using a chemical vapor deposition (CVD) apparatus. The photodiode 202 and the thin-film transistor 203 may be formed at the same timing of forming a film or different timings of forming films. For example, a stacked structure with the photodiode 202 formed on the upper portion of the thin-film transistor 203 may be formed, as illustrated in FIGS. 3A and 3B.

The drive circuit unit 206 is electrically connected to the drive line 205 of each row, and performs voltage control for the gate electrodes 203a of the thin-film transistors 203 for each row. More specifically, each of the drive lines 205 is electrically connected to the gate electrodes 203a of all of the pixels 200 in the corresponding one of the rows, and thus the drive circuit unit 206 can perform control on the thin-film transistors 203 for each row. When the voltage Von, sufficiently higher than the threshold voltage Vth to turn on the thin-film transistor 203, is applied to the drive lines 205, electrical signals stored in the pixels 200 are transferred to the amplification circuits 207. The drive circuit unit 206 applies the voltage Von to the drive lines 205, respectively corresponding to the first to the nth rows, sequentially in this order, to drive the pixel array unit 201 so that the electrical signals in the pixels 200 in all of the rows are read.

When the n-type thin-film transistor 203 is in the OFF state, the drive circuit unit 206 applies a negative voltage Voff of about −15 to −5 V to the gate electrode 203a. When the n-type thin-film transistor 203 is in the ON state, the drive circuit unit 206 applies the high voltage Von of about 5 to 20 V to the gate electrode 203a.

On the other hand, when the p-type thin-film transistor 203 is in the OFF state, the drive circuit unit 206 applies relatively high voltage Voff of about 5 to 20 V to the gate electrode 203a. When the p-type thin-film transistor 203 is in the ON state, the drive circuit unit 206 applies the voltage Von of about −15 to −5 V to the gate electrode 203a.

Most of the time, a voltage Voff for the OFF state is applied to the gate electrode 203a of the thin-film transistor 203. As a result, for the n-type thin-film transistor 203, a negative voltage is mainly applied to the gate electrode 203a and thus the threshold voltage is shifted to a negative side. For the p-type thin-film transistor 203, a positive voltage is mainly applied to the gate electrode 203a and thus the threshold voltage is shifted to a positive side.

The control unit 210 controls the reset switch 207c in the amplification circuit 207, the multiplexer 208, the ADC 209, the memory 211, the common voltage applying circuit unit 213, and the sample/hold circuit 214. The amplification circuit 207 in each column is electrically connected to the signal line 204, the sample/hold circuit 214, and the control unit 210, converts the electrical charges output to the signal line 204 in the column into a voltage, and outputs the resultant voltage to the sample/hold circuit 214. When the drive circuit unit 206 applies a voltage to a single one of the drive lines 205 after the entrance of the radiation, the electrical signals of the pixels 200 in the rows are output to the signal lines 204 in the columns. Each of the amplification circuits 207 converts the electrical charges output to the signal line 204 in the corresponding one of the columns into a voltage, and outputs the resultant voltage to the sample/hold circuit 214. After applying the voltage to the drive lines 205 in all of the rows, the drive circuit unit 206 starts applying the voltage again from the first row. This time, the electrical charges input to the amplification circuit 207 are of a value obtained by integrating the currently input electrical charges and the electrical charges that have been input. When the control unit 210 turns on the reset switch 207c via an amplification circuit reset line 212, the input electrical charges of the amplification circuit 207 are reset. Then, when the reset switch 207c is turned off, the amplification circuit 207 returns from the resetting state. The input electrical charges are reset with the reset switch 207c every time a signal for a single pixel is processed.

The sample/hold circuit 214 includes a sample/hold switch 215 and a sample/hold capacitor 216. When the control unit 210 turns on the sample/hold switch 215, the output signal from the amplification circuit 207 is written to the sample/hold capacitor 216. When the sample/hold switch 215 is turned off, the signal in the sample/hold capacitor 216 is held and output to the multiplexer 208.

The multiplexer 208 is electrically connected to the ADCs 209 and the sample/hold circuits 214, and sequentially outputs the output voltages from the sample/hold circuits 214 in the columns to the ADC 209. The ADC 209 is connected to the control unit 210 and the memory 211, converts an analog voltage input thereto into a digital voltage, and outputs the resultant digital signal to the memory 211. The memory 211 sequentially stores the digital signals input thereto, in such a manner that the digital signals are each stored together with position information of the pixel 200 (coordinate information of the x direction and the coordinate information of the y direction) corresponding to the digital signal.

The common voltage applying circuit unit 213 is electrically connected to the common electrode 202b of the photodiode 202 via the common voltage line 224 as illustrated in FIGS. 3A and 3B, and controls the voltage applied to the photodiode 202. When the radiation 104 enters, the photodiode 202 generates the electron and the hole. The electron and the hole are immediately recombined without a certain electric field in the photodiode 202. When this happens, the signal of the pixel 200 cannot be read. The maximum detectable amount of the radiation 104 depends on the voltage applied to the photodiode 202 from the common voltage applying circuit unit 213. The amount of electrical charges accumulated in the photodiode 202 is obtained by C×|Vs−Vref|, where Vs is a voltage applied to the common electrode 202b of the photodiode 202 from the common voltage applying circuit unit 213, Vref is the reference voltage applied to the amplification circuit 207, and C is the capacity of the photodiode 202. Thus, the photodiode 202 can accumulate a larger amount of electrical charge with a larger difference between Vs and Vref.

FIG. 4 is a timing chart illustrating a control method for the radiation imaging system 100 according to the present exemplary embodiment, and illustrates a control method for capturing still images with the radiation imaging system 100. FIG. 4 illustrates a power supply voltage 503, a radiation signal 502, and a drive signal 501. The power supply voltage 503 represents a power supply voltage applied to the radiation imaging apparatus 105 by operating the power supply switch 105a. The radiation signal 502 represents a signal supplied to the radiation source 103 from the radiation source control unit 102. The radiation source 103 does not emit the radiation 104 in a period in which the radiation signal 502 is at a low level, and emits the radiation 104 in a period in which the radiation signal 502 is at a high level. A drive state of the radiation imaging apparatus 105 where, while the amplification circuits 207 are driven, no drive on the pixel array unit 201 is performed by the drive circuit unit 206 is defined as a sleep drive. A drive state of the radiation imaging apparatus 105 where, while the amplification circuits 207 are driven, a read drive on the pixel array unit 201 is performed by the drive circuit unit 206 is defined as an idling drive.

Figure 5A:
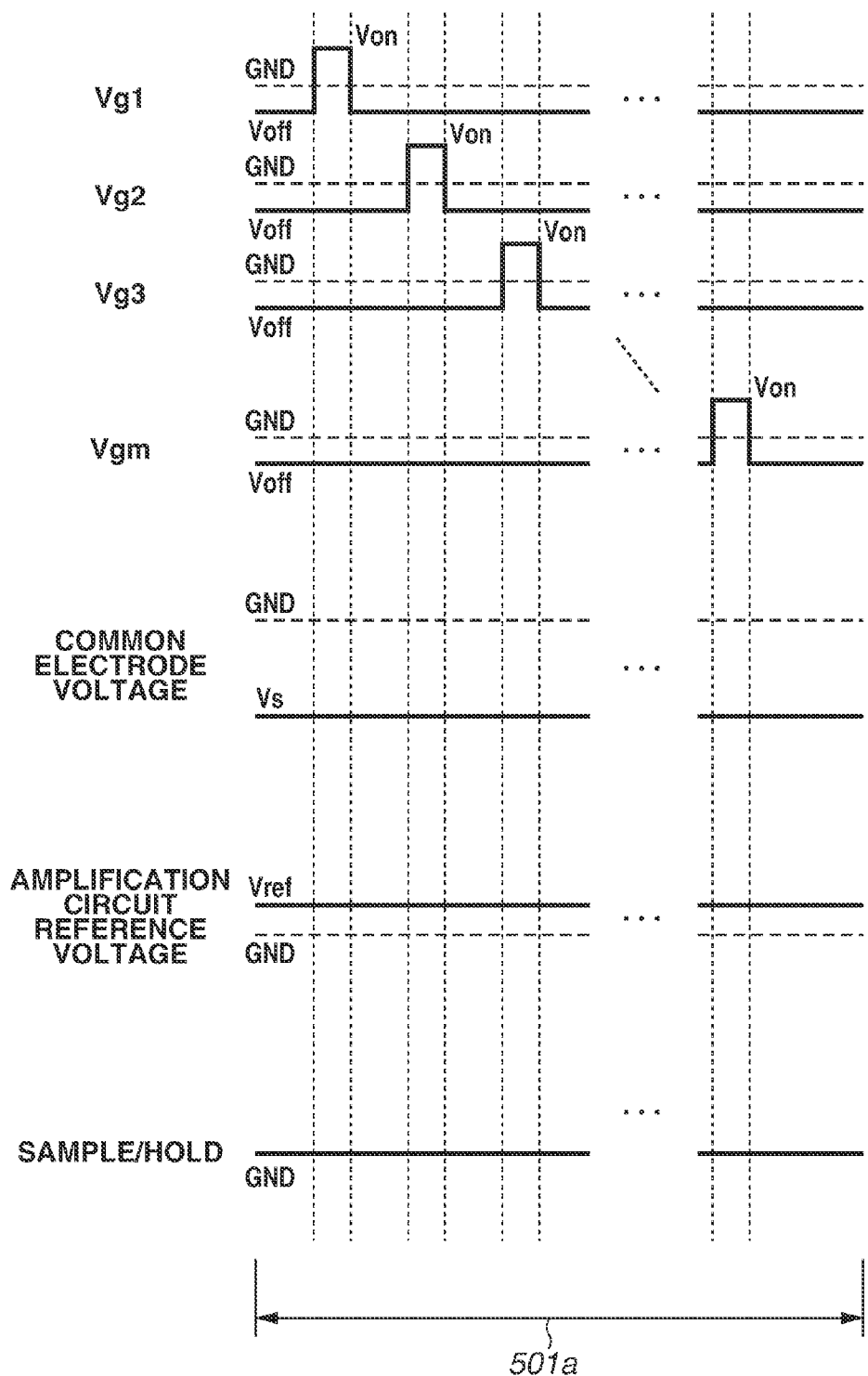
FIGS. 5A and 5B are timing charts respectively illustrating a dummy read sequence and a real read sequence.
Figure 5B:
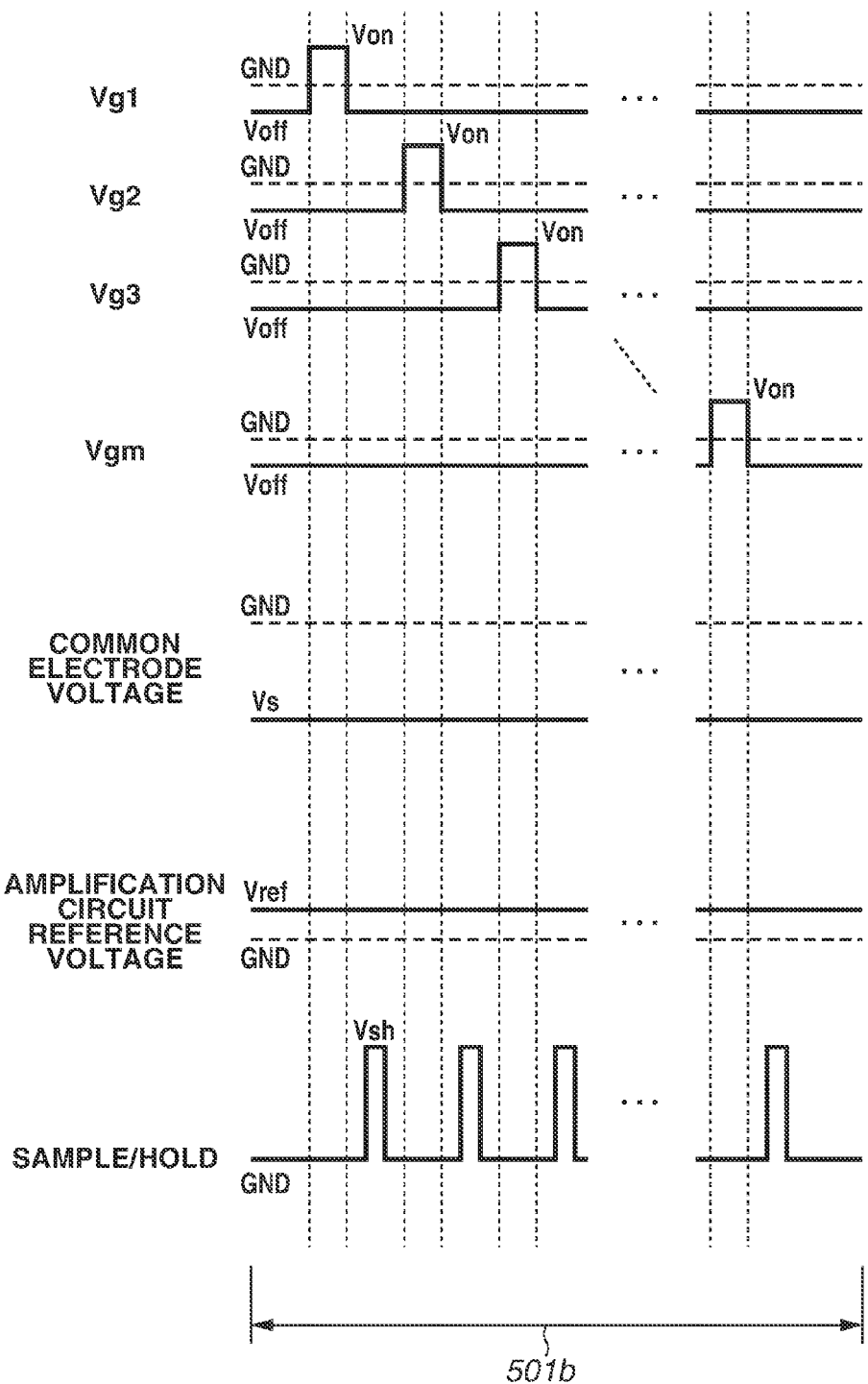
Figure 6A:
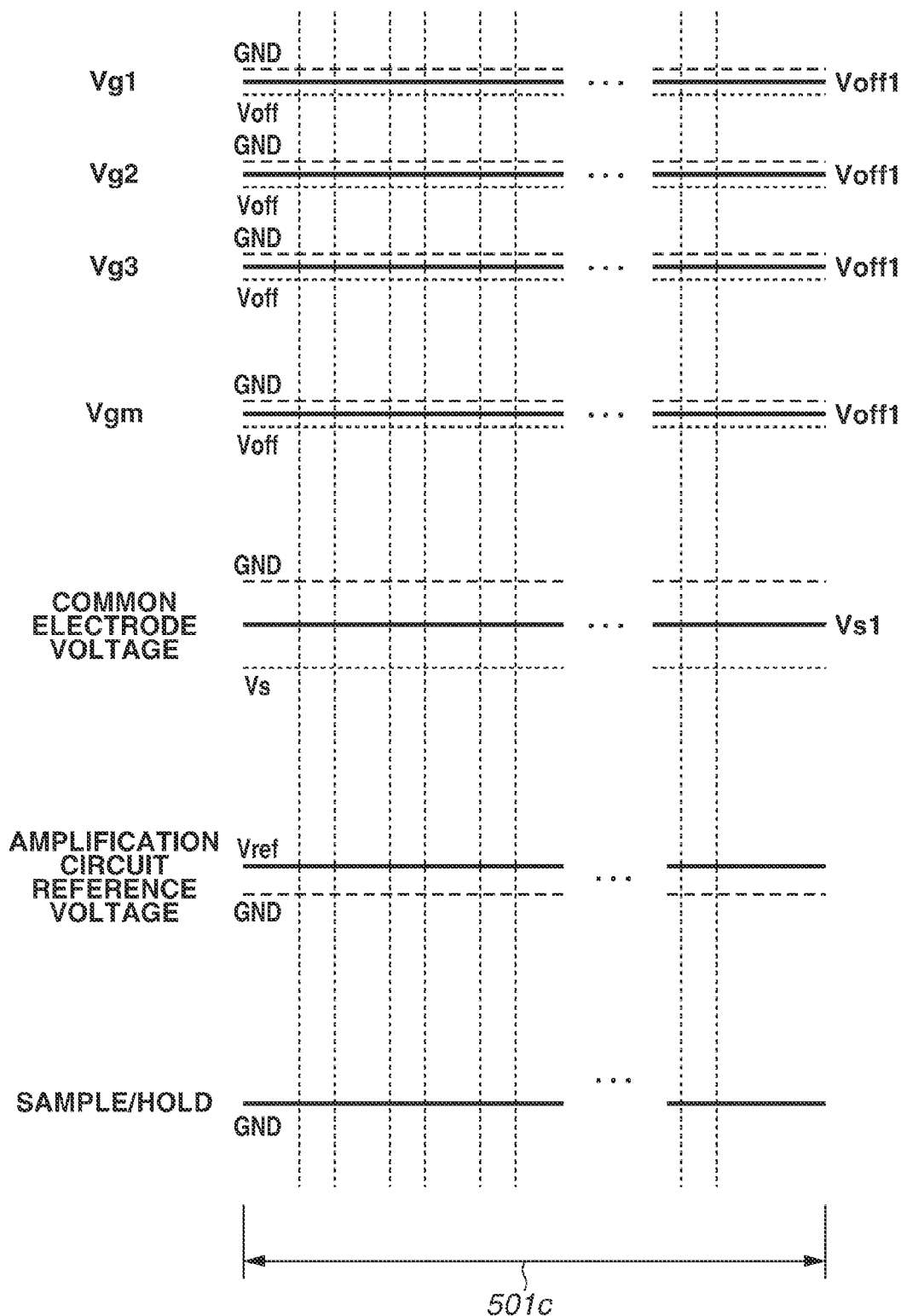
FIGS. 6A and 6B are each a timing chart illustrating a sleep drive sequence.
Figure 6B:
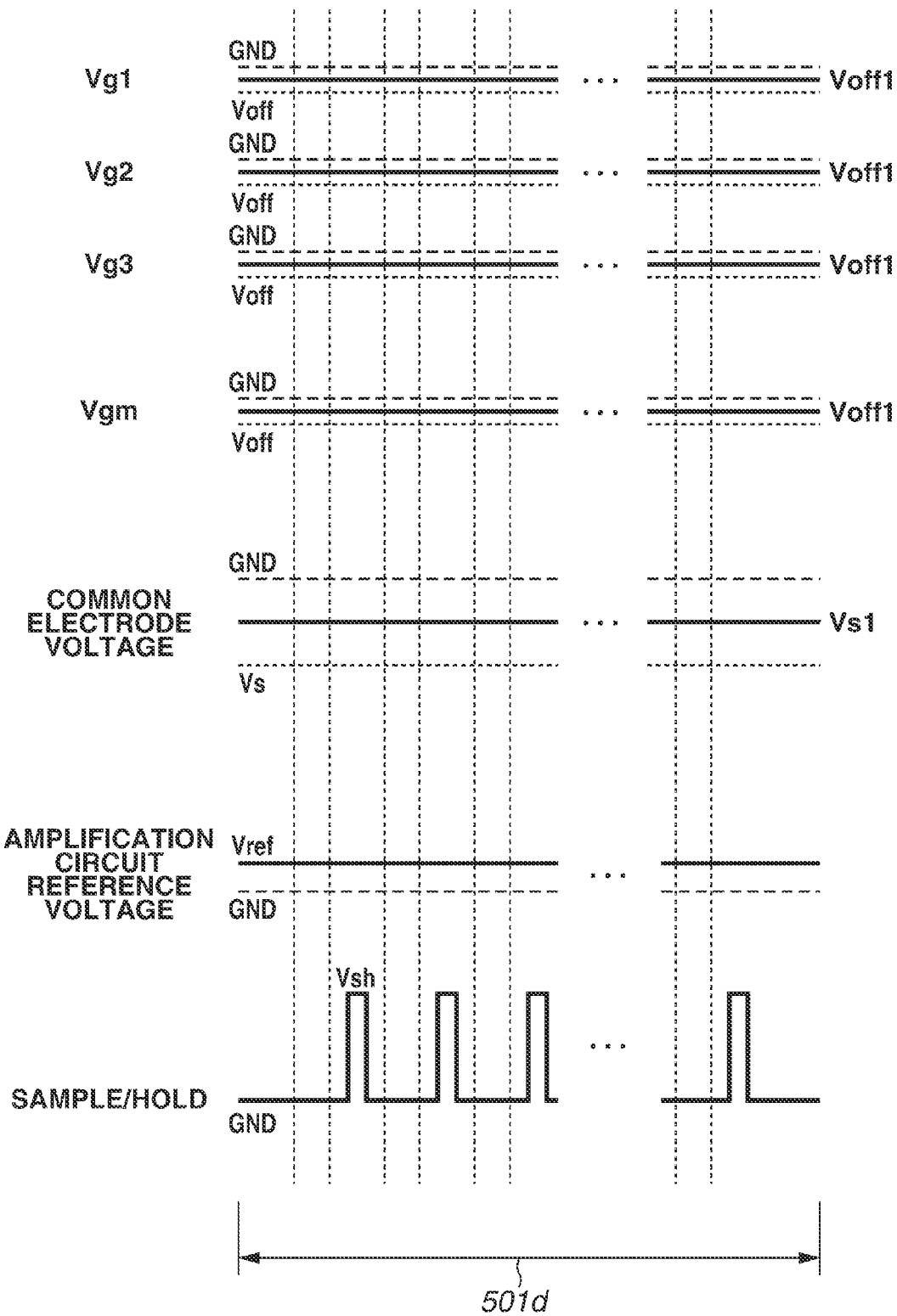

The drive signal 501 represents a signal supplied to the drive circuit unit 206 and the signal processing unit 217 from the control unit 210. The drive signals 501 include a dummy read drive signal 501a, a real read drive signal 501b, and a sleep drive signal 501c. FIG. 5A illustrates processing in a period in which the dummy read drive signal 501a is at the high level. FIG. 5B illustrates processing in a period in which the real read drive signal 501b is at the high level. FIGS. 6A and 6B illustrate processing in a period in which the sleep drive signal 501c or a sleep drive signal 501d is at the high level. FIGS. 5A, 5B, 6A, and 6B illustrate a voltage Vg1 applied to the gate electrodes 203a in the pixels 200 in the first row, a voltage Vg2 applied to the gate electrodes 203a in the pixels 200 in the second row, a voltage Vg3 applied to the gate electrodes 203a in the pixel 200 in the third row, and a voltage Vgm applied to the gate electrodes 203a in the pixels 200 in an mth row, as well as the voltage applied to the common electrode 202b, the reference voltage Vref applied to the amplification circuit 207, and an operation of the sample/hold circuit 214.

As illustrated in FIG. 4, first of all, when the power supply voltage 503 is applied, the radiation signal 502 is at the low level, and the radiation imaging apparatus 105 is driven in a sleep drive sequence 504a. In the sleep drive sequence 504a, the sleep drive signal 501c is at the high level, and the processing in FIG. 6A or 6B is executed. As illustrates in FIG. 6A or 6B, in the sleep drive sequence 504a, the drive circuit unit 206 sets all of the voltages Vg1 to Vgm applied to the gate electrodes 203a of the pixels 200 in all of the rows to the voltage Voff1. The voltage Voff1 is lower and higher respectively than the ON voltage Von and the OFF voltage Voff illustrated in FIG. 5A, and is not necessarily a voltage for turning off the thin-film transistor 203. In other words, the drive circuit unit 206 applies the voltage Voff1 that is between the OFF voltage Voff and the ON voltage Von and is different from OFF voltage Voff and the ON voltage Von to the plurality of drive lines 205. For example, the voltage Voff1 is 0 to 5 V. In one embodiment, the voltage Voff1 is lower than the threshold voltage Vth of the thin-film transistor 203 and is higher than the OFF voltage Voff. The voltage Voff1 may be substantially the same as a voltage Vref+Vth obtained by adding the reference voltage Vref, applied to the amplification circuit 207, to the threshold voltage Vth of the thin-film transistor 203. The voltage Voff1 has a value close to the voltage Vref+Vth so that the threshold voltage Vth can be efficiently prevented from shifting in the sleep drive sequence 504a. The common voltage applying circuit unit 213 may apply a second voltage Vs1 to the common electrodes 202b of all of the pixels 200. The second voltage Vs1 may be a voltage higher than a first voltage Vs illustrated in FIG. 5A and lower than a ground potential for maintaining a depression state of the pixel array unit 201 (photodiodes 202). The first voltage Vs and the second voltage Vs1 are both a negative voltage. An absolute value of the second voltage Vs1 is smaller than an absolute value of the first voltage Vs. In another embodiment, the voltage Vs1 is higher than the voltage Vs and is lower than the ground potential, for the sake of energy conservation and the like. The voltage Vs1 may be equal to the voltage Vs. The control unit 210 applies the reference voltage Vref, which is higher than the ground potential, to all of the amplification circuits 207. The power supply voltage is applied to all of the amplification circuits 207. The sample/hold switch 215 in each column is OFF, and thus the output signal from the amplification circuit 207 in the column is not written to the sample/hold capacitor 216 in the column.

Next, the radiation imaging apparatus 105 is driven in a real read drive sequence 504b in FIG. 4. In the real read drive sequence 504b, as illustrated in FIG. 5B, the common voltage applying circuit unit 213 applies the first voltage Vs to the common electrodes 202b of all of the pixels 200, in accordance with the control performed by the control unit 210. The voltage Vs is lower than the ground potential. The control unit 210 applies the reference voltage Vref to all of the amplification circuits 207. The power supply voltage is applied to all of the amplification circuits 207. First of all, the drive circuit unit 206 raises the voltage Vg1 of the gate electrodes 203a of the pixels 200 in the first row from the OFF voltage Voff to the ON voltage Von, and then lowers the voltage Vg1 from the ON voltage Von to the OFF voltage. The ON voltage Von is a positive voltage for turning on the thin-film transistor 203. The OFF voltage Voff is a negative voltage for turning off the thin-film transistor 203. When the thin-film transistors 203 of the pixels 200 in the first row are turned on, the electrical charges accumulated in the photodiodes 202 are output to the signal lines 204. The sample/hold switch 215 in each column is ON during periods with a high level pulse Vsh, and the output signal from the amplification circuit 207 in each column is written to the sample/hold capacitor 216 in the column. The voltage, written to the sample/hold capacitor 216, is transferred to the ADC 209 by the multiplexer 208 to be converted into digital data. The multiplexer 208 is electrically connected to the plurality of sample/hold capacitors 216, and sequentially transfers the voltages to the ADC 209. Thus, the ADC 209 converts the voltages thus sequentially transferred thereto one by one into the digital data. In periods in which the signals corresponding to the multiplexer 208 and the ADC 209 are at the high level, the signals from the sample/hold capacitors 216 are sequentially transferred to the ADC 209 by the multiplexer 208, to be converted by the ADC 209 into the digital signals. The signals of the pixels 200 in the first column are written to the memory 211. Next, the drive circuit unit 206 raises the voltage Vg2 of the gate electrodes 203a of the pixels 200 in the second column from the OFF voltage Voff to the ON voltage Von, and then lowers the voltage Vg2 from the ON voltage Von to the OFF voltage Voff. When the thin-film transistors 203 in the pixels 200 in the second row are turned on, the electrical charges accumulated in the photodiode 202 are output to the signal lines 204. The sample/hold switch 215 in each column is ON during the periods with the high level pulse Vsh, and thus the output signal from the amplification circuit 207 in the column is written to the sample/hold capacitor 216 in the column. Thus, the signals of the pixels 200 in the second row are written to the memory 211. In this manner, the voltages V1 to Vm of the gate electrodes 203a of the pixels 200 in the first to the mth rows are sequentially raised to be at the high level. Thus, the electrical charges, accumulated in the photodiodes 202 of the pixels 200 in the first to the mth rows, are sequentially output to the signal lines 204. As described above, in the real read drive sequence 504b, the drive circuit unit 206 sequentially applies the OFF voltage Voff for tuning off the thin-film transistor 203 and the ON voltage Von for turning on the thin-film transistor 203 to the plurality of drive lines 205. Thus, the electrical signals stored in the pixels 200, including the conversion element (the scintillator and the photodiode 202), are output to the signal lines 204.

In the real read drive sequence 504b, the radiation imaging apparatus 105 executes the processing illustrated in FIG. 5B for a plurality of times, so that the fixed pattern noise (dark image), corresponding to the state where the radiation 104 is not emitted, is stored in the memory 211. The fixed pattern noise is output to the signal lines 204 for a plurality of times, because the noise components can be more reduced through averaging with a larger number of times the fixed pattern noise is output. The fixed pattern noise acquired after the power is supplied in FIGS. 6A and 6B may be acquired after the radiation image is acquired.

Next, the radiation imaging apparatus 105 is driven in a dummy read drive sequence 504c illustrated in FIG. 4. As illustrated in FIG. 5A, in the dummy read drive sequence 504c, the common voltage applying circuit unit 213 applies the voltage Vs to the common electrodes 202b of all of the pixels 200, in accordance with control performed by the control unit 210. The control unit 210 supplies the reference voltage Vref to all of the amplification circuits 207. The power supply voltage is applied to all of the amplification circuits 207. The sample/hold switch 215 in each column is OFF, and thus the output signal from the amplification circuit 207 in the column is not written to the sample/hold capacitor 216 in the column. First of all, the drive circuit unit 206 raises the voltage Vg1 applied to the gate electrodes 203a of the pixels 200 in the first row from the OFF voltage Voff to the ON voltage Von, and then lowers the voltage Vg1 from the ON voltage Von to the OFF voltage Voff. The thin-film transistors 203 in the pixels 200 in the first row are turned on, and the electrical charges accumulated in the photodiodes 202 are output to the signal lines 204. Then, the drive circuit unit 206 raises the voltage Vg2 applied to the gate electrodes 203a of the pixels in the second column from the OFF voltage Voff to the ON voltage Von, and then lowers the voltage Vg2 from the ON voltage Von to the OFF voltage Voff. The thin-film transistors 203 in the pixels 200 in the second row are turned on, and the electrical charges accumulated in the photodiodes 202 are output to the signal lines 204. In this manner, the voltages V1 to Vm of the gate electrodes 203a of the pixels 200 in the first to the mth rows are sequentially raised to be at the high level. Thus, the electrical charges, accumulated in the photodiodes 202 of the pixels 200 in the first to the mth rows, are sequentially output to the signal lines 204. In the dummy read drive sequence 504c, the electrical charges accumulated in the photodiodes 202, corresponding to the dark image components, are output to the signal lines 204 via the thin-film transistors 203. The voltages Vs and Vref in FIG. 5A may be equal to the ground potential.

In the dummy read drive sequence 504c, the electrical charges accumulated in the photodiodes 202, corresponding to the dark image components, are constantly discarded through the signal lines 204. When the radiation technician presses the exposure switch 101 during the dummy read drive sequence 504c, the radiation source control unit 102 issues a radiation emission instruction to the radiation source 103, and thus the radiation source 103 emits the radiation 104. The radiation emission instruction is also transmitted to the radiation imaging apparatus 105 via the information processing unit 106. Thus, the radiation imaging apparatus 105 stops driving in the dummy read drive sequence 504c and starts driving in a wait period sequence 504d. The radiation 104 might be emitted during the dummy read drive sequence 504c with no radiation emission instruction transmitted to the radiation imaging apparatus 105. In such a case, the radiation imaging apparatus 105 detects the emission of the radiation 104, and stops the dummy read drive sequence 504c to start driving in the wait period sequence 504d.

With the radiation emission instruction, the radiation signal 502 becomes the high level, and thus the radiation source 103 emits the radiation 104. In this period, the radiation imaging apparatus 105 is driven in the wait period sequence 504d. In the wait period sequence 504d, the drive circuit unit 206 sets the voltages Vg1 to Vgm applied to the gate electrodes 203a of the pixels 200 in all of the rows to the OFF voltage Voff. The common voltage applying circuit unit 213 applies the voltage Vs to the common electrodes 202b of all of the pixels 200. The control unit 210 supplies the reference voltage Vref to all of the amplification circuits 207. The sample/hold switch 215 in each column is OFF, and thus the output signal from the amplification circuit 207 in the column is not written to the sample/hold capacitor 216 in the column. With the plurality of pixels 200 irradiated with the radiation 104 in the state where the voltages Vg1 to Vgm applied to the gate electrodes 203a of the pixels 200 in all of the rows are set to the OFF voltage Voff, electrical signals, corresponding to the radiation 104, are stored in the plurality of pixels 200. Thus, with the plurality of pixels 200 irradiated with the radiation 104 during the wait period sequence 504d, the electrical signals, corresponding to the radiation 104, are stored in the plurality of pixels 200. Here, control performed so that the electrical signals are stored in the plurality of pixels 200 is referred to as storage control, and a period during which the storage control is performed is referred to as a storage period.

After the emission of the radiation 104 is terminated, the radiation imaging apparatus 105 is driven in a real read drive sequence 504e. In the real read drive sequence 504e, the control unit 210 performs the control as in the real read drive sequence 504b illustrated in FIG. 5B described above. Thus, the electrical signals stored in all of the pixels 200 are transferred to the signal lines 204 by the control unit 210, to be read by the signal processing unit 217, whereby the radiation image, corresponding to the state where the radiation 104 is emitted, is stored in the memory 211. For example, the information processing unit 106 generates an image based on a difference between the radiation image and the dark image, and thus the image with the fixed pattern noise removed can be obtained. The control of reading the electrical signals, corresponding to the radiation 104, from the plurality of pixels 200 is referred to as real read control, and a period in which the real read control is performed is referred to as a real read period.

After the real read drive sequence 504e is terminated, the radiation imaging apparatus 105 is driven in a sleep drive sequence 504f. The sleep drive sequence 504f is in a period between one imaging and the next imaging, and is the same as the sleep drive sequence 504a illustrated in FIG. 6A or 6B. Here, the control unit 210 performs control so that the voltage Voff1 between the OFF voltage and the ON voltage and is different from the OFF voltage and the ON voltage is applied to the plurality of drive lines 206. This control is referred to as threshold voltage shift prevention control, and a period during which the threshold voltage shift prevention control is performed is referred to as a prevention period. Thus, the sleep drive sequence 504f corresponds to the threshold voltage shift prevention control performed by the control unit 210 in a different period different from the storage period in which the storage control is performed and the real read period in which the real read control is performed. The shifting of the threshold voltage Vth of the thin-film transistor 203 is highly attributable to driving in this period corresponding to the sleep drive sequence 504f. Thus, in this period, the threshold voltage Vth of the thin-film transistor 203 is to be prevented from shifting so that reliable image data can be obtained. Thus, in FIG. 6A or 6B, the voltage Voff1 is set to be substantially equal to Vref +Vth, and the voltage applied to the common electrode 202b of the photodiode 202 is set to the voltage Vs1. FIG. 6B is only different from FIG. 6A in that the sample/hold circuit 214, the multiplexer 208, and the ADC 209 are driven in the sleep drive sequence 504f, and the control in any one of FIGS. 6A and 6B may be employed. The electrical signal obtained by the control illustrated in FIG. 6B may not be used for actual image forming. The voltage Vs1 is lower than the ground potential and is higher than the voltage Vs, and is used for maintaining the depression state. With the voltage Voff1 set to be about Vref +Vth, the threshold voltage can be prevented from shifting. Furthermore, with the voltage applied to the common electrode 202b set to the voltage Vs1, the radiation imaging apparatus 105 can be immediately used in a state with a predetermined number of dark image components and with the temperature drift of the amplification circuit 207 reduced with the power consumed due to the power supply voltage supplied to the amplification circuit 207. The voltage Voff1 that may be set to about the Vref +Vth as described above, may also be a value smaller than 0 V and larger than the voltage Vss in the actual control.

When the next imaging is performed after the sleep drive sequence 504f is maintained for a certain period of time, the radiation imaging apparatus 105 is driven in a dummy read drive sequence 504g so that the electrical charges accumulated in the photodiode 202 that are no longer required are discarded. The dummy read drive sequence 504g is the same as the dummy read drive sequence 504c described above. The fixed pattern noise may be acquired in the dummy read drive sequence 504g to be used as correction data for the later imaging.

Then, the radiation 104 is emitted in accordance with the radiation signal 502, and the radiation imaging apparatus 105 is driven in a wait period sequence 504h that is the same as the wait period sequence 504d described above.

When the emission of the radiation 104 is terminated, the radiation imaging apparatus 105 is driven in a real read drive sequence 504i that is the same as the real read drive sequence 504e described above. The imaging is performed for the first time in the real read drive sequence 504e, and the imaging is performed for the second time in the real read drive sequence 504i. The sleep drive sequence 504f is executed between the real read drive sequences 504e and 504i.

FIG. 7 is a timing chart illustrating a control method for the radiation imaging system 100 according to a second exemplary embodiment of the present invention, and illustrates a control method for capturing a moving image in a period in which the radiation 104 is continuously emitted in the radiation imaging system 100. Points in the present exemplary embodiment (FIG. 7) different from the first exemplary embodiment (FIG. 4) will be described below.

First of all, when the power supply voltage 502 is applied, the radiation signal 502 is at the low level, and the radiation imaging apparatus 105 is driven in a sleep drive sequence 701a that is the same as the sleep drive sequence 504a in FIG. 4 (FIG. 6A or 6B).

Next, the radiation imaging apparatus 105 is driven in a real read drive sequence 701b that is the same as the real read drive sequence 504b in FIG. 4 (FIG. 5B), and thus the fixed pattern noise (dark image) is written to the memory 211.

Next, the radiation imaging apparatus 105 is driven in a dummy read drive sequence 701c that is the same as the dummy read drive 504c in FIG. 4 (FIG. 5A).

Next, the radiation imaging apparatus 105 is driven in a wait period sequence 701d that is the same as the wait period sequence 504d in FIG. 4. The radiation signal 502 becomes the high level due to the radiation emission instruction issued during the wait period sequence 701d, and thus the radiation source 103 starts emitting the radiation 104.

Next, the radiation imaging apparatus 105 is driven in a real read drive sequence 701e that is the same as the real read drive sequence 504e in FIG. 4 (FIG. 5B), and thus a first moving image is captured and is written to the memory 211. Then, when the radiation signal 502 becomes the low level, the radiation source 103 stops emitting the radiation 104. Thus, the radiation imaging apparatus 105 stops driving in the real read drive sequence 701e. The storage control in the present exemplary embodiment corresponds to control performed in a period, in the wait period sequence 701d, in which the plurality of the pixels 200 is irradiated with the radiation 104, and control performed in a period, in the real read drive sequence 701e, in which the real read drive signal 501b is at the low level. The real read control in the present exemplary embodiment corresponds to control performed in a period, in the real read drive sequence 701e, in which the real read drive signal 501b is at the high level. The present invention is not limited to the configuration described herein in which the radiation signal 502 is constantly at the high level in the period of the real read drive sequence 701e. The moving image may be captured with the radiation 104 intermittently emitted, with the radiation signal 502 being at the low level in a period in which the real read drive signal 501b is at the low level in the period of the real read drive sequence 701e.

Next, the radiation imaging apparatus 105 is driven in a sleep drive sequence 701f that is the same as the sleep drive sequence 504f in FIG. 4 (illustrated in detail in FIG. 6A or 6B).

After the sleep drive sequence 701f, as in FIG. 4, the radiation imaging apparatus 105 repeats the dummy read drive sequence 701c, the wait period sequence 701d, and the real read drive sequence 701e for capturing the moving image for the second time. The moving image is captured for the second time through the real read drive sequence 701e for capturing the moving image for the second time.

As described above, also in the present exemplary embodiment, the control unit 210 performs the control in the sleep drive sequence 701f in a different period different from the periods in which the storage control and the real read control are performed. In the present exemplary embodiment, the sleep drive sequence 701f is between the real read drive sequence 701e for capturing the moving image for the first time and the real read drive sequence 701e for capturing the moving image for the second time.

Next, a third exemplary embodiment of the present invention will be described with reference to FIGS. 8A and 8B. Points in the third exemplary embodiment (FIGS. 8A and 8B) different from the control method described in the first and the second exemplary embodiments are described below.

In the first exemplary embodiment, the control is performed when the drive signals of the sleep drive sequence 504a and the sleep drive sequence 504f are high (FIG. 6A or 6B) with the voltage applied to the thin-film transistors 203 fixed to the voltage Voff1. In the second exemplary embodiment, the control is performed when the drive signals of the sleep drive sequence 701a and the sleep drive sequence 701e are high (FIG. 6A or 6B) with the voltage applied to the thin-film transistors 203 fixed to the voltage Voff1. In the third exemplary embodiment, unlike in FIG. 6A or 6B, the ON voltage Von is applied as illustrated in FIG. 8A or 8B. Thus, FIGS. 8A and 8B illustrate the idling drive in which the ON voltage Von and the OFF voltage Voff1 are applied, unlike in the sleep drive in which the voltage applied to all of the gate electrodes 203a are fixed. Thus, in the present exemplary embodiment performed with an idle drive signal 501e or 501f, the idling drive corresponds to the threshold voltage shift prevention control. Thus, the threshold voltage shift prevention control may be performed with only the OFF voltage Voff1 supplied and may also be performed with the OFF voltage Voff1 and the ON voltage Von alternately supplied. In FIG. 8A, the ON voltage Von is sequentially applied during a period between timings at which the OFF voltage Voff1 is applied to the gate electrode 203a of the thin-film transistor 203. In FIG. 8B, the sample/hold circuit 214, the multiplexer 208, and the ADC 209 are driven after the ON voltage Von is applied to the gate electrode 203a. The fixed pattern noise may be acquired again in the idling drive sequence 501f illustrated in FIG. 8F, to be used as correction data in the later imaging. In the first to the third exemplary embodiments, the temperature drift of the amplification circuit 207 can be reduced and the number of dark image components can be prevented from varying in the radiation imaging apparatus 105 at the time of emergency use. Furthermore, a stable image can be constantly formed even at the time of emergency use, with the threshold voltage Vth of the thin-film transistor 203 maintained at a constant value.

The exemplary embodiments described above are merely examples of how the present invention is specifically implemented, and thus does not limit the scope of the present invention. Thus, the present invention can be implemented in various ways without departing from the technical idea and the main features of the present invention.

According to the present invention, a stable image can be constantly generated even at the time of emergency, with the number of dark image components prevented from varying and a threshold voltage of a transistor prevented from shifting, in use at the time of emergency.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-089366, filed Apr. 24, 2015, and No. 2016-035845, filed Feb. 26, 2016, which are hereby incorporated by reference herein in their entirety.

What is claimed is:

1. A radiation imaging apparatus comprising:
a plurality of pixels arranged in a form of a matrix, wherein each pixel is configured to generate an electrical signal in response to penetrating EM radiation incident upon the pixels, each pixel including a conversion element and a transistor;
a plurality of drive lines electrically connected to gates of the transistors of the plurality of pixels;
a drive circuit unit configured to supply a voltage to each drive line to drive the plurality of pixels; and
a control unit configured to control the drive circuit unit,
wherein the conversion element includes a scintillator that converts penetrating EM radiation into light, and a photodiode that converts the light into an electrical charge, and the photodiode includes an intrinsic semiconductor layer disposed between a first electrode and a second electrode, a first-type semiconductor layer disposed between the first electrode and the intrinsic semiconductor layer, and a second-type semiconductor layer disposed between the intrinsic semiconductor layer and the second electrode,
wherein the transistor is a first-type thin-film transistor having a first-type semiconductor layer, one of a source and a drain of the transistor being electrically connected to the first electrode, and
wherein the control unit performs
storage control, causing the drive circuit unit to apply an OFF voltage, for turning off the transistor, to each drive line, so that the electrical signal is stored in each pixel,
read control, causing the drive circuit unit to apply an ON voltage, for turning on the transistor, sequentially to each drive line, so that the electrical signal is read from each pixel, and
control, causing the drive circuit unit to apply a different voltage that is between the OFF voltage and the ON voltage and is different from the OFF voltage and the ON voltage to each drive line in a different period different from a period in which the storage control is performed and a period in which the read control is performed.

2. The radiation imaging apparatus according to claim 1, wherein the control unit causes the drive circuit unit to apply the voltage that is between the OFF voltage and a threshold voltage of the transistor and is different from the OFF voltage and the threshold voltage to each drive line in the different period.

3. The radiation imaging apparatus according to claim 2, wherein the control unit causes the drive circuit unit to alternately apply the different voltage and the ON voltage to each drive line in the different period.

4. The radiation imaging apparatus according to claim 2, wherein the other of the source and the drain of the transistor is connected to any one of a plurality of signal lines.

5. The radiation imaging apparatus according to claim 4, wherein the second electrode is an anode of the photodiode,
wherein the first electrode is a cathode of the photodiode, and
wherein the transistor is an n-type thin-film transistor including an n-type semiconductor layer.

6. The radiation imaging apparatus according to claim 5, further comprising a common voltage applying unit configured to apply a common voltage to the anode of the photodiode in the plurality of pixels.

7. The radiation imaging apparatus according to claim 6, wherein the common voltage applying unit applies a first voltage in the read period, and
wherein the common voltage applying unit applies a second voltage in a sleep period.

8. The radiation imaging apparatus according to claim 7, wherein an absolute value of the second voltage is smaller than an absolute value of the first voltage.

9. The radiation imaging apparatus according to claim 7, wherein the first voltage and the second voltage are each a negative voltage.

10. The radiation imaging apparatus according to claim 4, further comprising a signal processing unit electrically connected to the plurality of signal lines,
wherein a power supply voltage is applied to the signal processing unit in the period in which the control unit performs the read control and in the different period.

11. The radiation imaging apparatus according to claim 10,
wherein the signal processing unit includes a plurality of amplification circuits each including a differential amplifier configured to receive a voltage of a corresponding one of the plurality of signal lines and a reference voltage, and
wherein in the different period, the control unit causes the drive circuit unit to apply a voltage substantially equal to a voltage obtained by adding the threshold voltage of the transistor to the reference voltage to the drive lines.

12. The radiation imaging apparatus according to claim 10,
wherein the signal processing unit includes a plurality of sample/hold circuits configured to write output signals from a plurality of amplification circuits respectively to a plurality of sample/hold capacitors,
wherein the plurality of sample/hold circuits writes the output signals from the plurality of amplification circuits respectively to the plurality of sample/hold capacitors in the read period, and
wherein the control unit performs control so that the plurality of sample/hold circuits does not write the output signals from the plurality of amplification circuits respectively to the plurality of sample/hold capacitors in the different period.

13. The radiation imaging apparatus according to claim 10,
wherein the signal processing unit further includes a plurality of sample/hold circuits configured to write output signals from a plurality of amplification circuits respectively to a plurality of sample/hold capacitors, and
wherein the control unit performs control so that the plurality of sample/hold circuits writes the output signals from the plurality of amplification circuits respectively to the plurality of sample/hold capacitors in the read period and the different period.

14. A radiation imaging system comprising:
the radiation imaging apparatus according to claim 1; and
a radiation source configured to emit penetrating EM radiation.

15. A control method for radiation imaging apparatus including
a plurality of pixels arranged in a form of a matrix and configured to generate an electrical signal in response to penetrating EM radiation incident upon the pixels, each pixel including a conversion element and a transistor, the conversion element including a scintillator that converts penetrating EM radiation into light, and a photodiode that converts the light into an electrical charge, the photodiode including an intrinsic semiconductor layer disposed between a first electrode and a second electrode, a first-type semiconductor layer disposed between the first electrode and the intrinsic semiconductor layer, and a second-type semiconductor layer disposed between the intrinsic semiconductor layer and the second electrode, the transistor being a first-type thin-film transistor having a first-type semiconductor layer, one of a source and a drain of the transistor being electrically connected to the first electrode,
a plurality of drive lines electrically connected to gates of the transistors of the plurality of pixels, and
a drive circuit unit configured to supply a voltage to each drive line to drive the plurality of pixels, the control method comprising:
performing storage control, causing the drive circuit unit to apply an OFF voltage, for turning off the transistor, to each drive line, so that the electrical signal is stored in each pixel;
performing read control, causing the drive circuit unit to apply an ON voltage, for turning on the transistor, sequentially to each drive line, so that the electrical signal is read from each pixel; and
performing control, causing the drive circuit unit to apply a different voltage that is between the OFF voltage and the ON voltage and is different from the OFF voltage and the ON voltage to each drive line in a different period different from a period in which the storage control is performed and a period in which the read control is performed.

* * * * *